United States Patent
May

(10) Patent No.: US 6,638,776 B2
(45) Date of Patent: Oct. 28, 2003

(54) THERMAL CHARACTERIZATION COMPENSATION

(75) Inventor: Charles E. May, Gresham, OR (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/077,497

(22) Filed: Feb. 15, 2002

(65) Prior Publication Data
US 2003/0157735 A1 Aug. 21, 2003

(51) Int. Cl.⁷ .............................................. H01L 21/00
(52) U.S. Cl. ........................ 438/5; 438/14; 438/795; 438/799; 438/800; 438/980; 700/121
(58) Field of Search ........................ 438/14, 800, 197, 438/663, 5, 795, 799, 980; 700/121

(56) References Cited

U.S. PATENT DOCUMENTS

| | | | | |
|---|---|---|---|---|
| 5,508,216 A | * | 4/1996 | Inoue ............................. | 438/151 |
| 5,960,270 A | * | 9/1999 | Misra et al. ................... | 438/197 |
| 6,235,563 B1 | * | 5/2001 | Oka et al. ...................... | 438/166 |
| 6,362,038 B1 | * | 3/2002 | Lee et al. ...................... | 438/225 |

* cited by examiner

Primary Examiner—Amir Zarabian
Assistant Examiner—Christy Novacek
(74) Attorney, Agent, or Firm—Luedeka, Neely & Graham PC

(57) ABSTRACT

A method of standardizing a fabrication process for an integrated circuit. The fabrication process includes a preceding thermal energy sensitive process and at least one set of selectable succeeding thermal energy delivery processes. An integrated circuit structure is formed using the preceding thermal energy sensitive process. The preceding thermal energy sensitive process is characterized based at least in part upon the greatest amount of thermal energy delivered to the integrated circuit by one of the set of selectable succeeding thermal energy delivery processes. Then as subsequent processes are selected and accomplished, if they do not deliver the greatest amount of thermal energy as anticipated by the preceding thermal energy sensitive process, an additional amount of thermal energy is added, so as to preferably equal the anticipated greatest amount of thermal energy. In this manner, the characterization of the preceding thermal energy sensitive process attains its desired parameters.

20 Claims, 2 Drawing Sheets

THERMAL CHARACTERIZATION COMPENSATION

FIELD

This invention relates to the field of integrated circuit fabrication. More particularly, this invention relates to integrated circuit characterization based upon the amount of thermal energy to which the integrated circuit is exposed.

BACKGROUND

Integrated circuits, such as those based upon semiconductor technology like silicon, germanium, and III–IV compounds, tend to be sensitive to the amount of thermal energy that they are exposed to. For example, as a part of the fabrication process for some integrated circuits, certain atomic species, generally referred to as dopants, are introduced into the integrated circuit to form various structures. One specific method for doing this is ion implantation, where the dopant species is accelerated toward the integrated circuit substrate, and driven into the surface of the integrated circuit substrate by the momentum of the accelerated species.

The initial nominal depth of the dopant below the surface of the substrate and the distribution of the dopant about that nominal depth are carefully controlled so as to eventually result in a dopant profile that enables the portion of the substrate so effected to behave according to a set of desired electrical properties. As a part of this process, the dopant is typically thermally activated in some manner. Most often, this thermal activation is accomplished with an anneal of some type, such as a rapid thermal anneal or a furnace anneal.

The amount of thermal energy to which the integrated circuit is exposed tends to be critical, as it effects the dopant profile. The amount of such thermal energy is most easily controlled by controlling the temperatures to which the integrated circuit is exposed and the length of time at which the integrated circuit is exposed to the temperatures. Thus, post doping anneals are carefully controlled as to length of time of exposure and temperature of exposure.

However, there are other processes to which the integrated circuit is necessarily exposed after such thermal energy sensitive operations, which also expose the integrated circuit to thermal energy. Thus, such subsequent processes are generally accounted for during the doping and annealing processes, so that the final structures created at completion of the fabrication process perform as desired. Unfortunately, different integrated circuits tend to require different processing steps, which situation tends to require that many, many different processes be used for early formation of the structures, so as to account for the many different processing tracks that will selectively be used for final processing steps.

Although the above issues have been presented with specific reference to the example of implantation of a dopant as the thermally sensitive operation, it is appreciated that there are many such thermal energy sensitive operations that are performed and structures that are created during fabrication of the integrated circuit. For further example, many materials that are formed into adjacent structures tend to inter diffuse one into the other as thermal energy is absorbed through subsequent processing. Such inter diffusion, if not properly accounted for, tends to change the critical and desirable characterizations of the integrated circuit, such as electrical and physical characterizations.

What is needed, therefore, is a method for processing integrated circuits where earlier processes can be standardized regardless of the subsequent processing of the integrated circuit.

SUMMARY

The above and other needs are met by a method of standardizing a fabrication process for an integrated circuit. The fabrication process includes a preceding thermal energy sensitive process and at least one set of selectable succeeding thermal energy delivery processes. Each one of the set of selectable succeeding thermal energy delivery processes delivers different amounts of thermal energy to the integrated circuit, where one of the different amounts of thermal energy is a greatest amount of thermal energy.

An integrated circuit structure is formed using the preceding thermal energy sensitive process. The preceding thermal energy sensitive process is characterized based at least in part upon the greatest amount of thermal energy delivered to the integrated circuit by one of the set of selectable succeeding thermal energy delivery processes. In the case where one of the set of selectable succeeding thermal energy delivery processes is selected that delivers an actual amount of thermal energy to the integrated circuit that is less than the greatest amount of thermal energy, an additional amount of thermal energy is delivered to the integrated circuit. The additional amount of thermal energy is equal to a difference between the actual amount of thermal energy and the greatest amount of thermal energy.

In this manner, the preceding thermal energy sensitive process preferably requires only a single configuration that takes into account the amount of thermal energy that will be subsequently delivered to the integrated circuit. Then as subsequent processes are selected and accomplished, if they do not deliver the greatest amount of thermal energy as anticipated by the preceding thermal energy sensitive process, an additional amount of thermal energy is added, so as to preferably equal the anticipated greatest amount of thermal energy. In this manner, the characterization of the preceding thermal energy sensitive process attains its desired parameters, regardless of the amount of thermal energy actually delivered by the subsequent process.

In various preferred embodiments, the at least one set of selectable succeeding thermal energy delivery processes includes deposition anneal process and oxidation processes, such as gate oxidation processes. The preceding thermal energy sensitive process preferably includes implantation of a dopant, fabrication of a transistor junction, and fabrication of an inter diffused region between two adjacent dissimilar material layers, such as a silicide region. Most preferably, the additional amount of thermal energy is delivered to the integrated circuit as a thermal anneal in a chemically non reactive environment.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
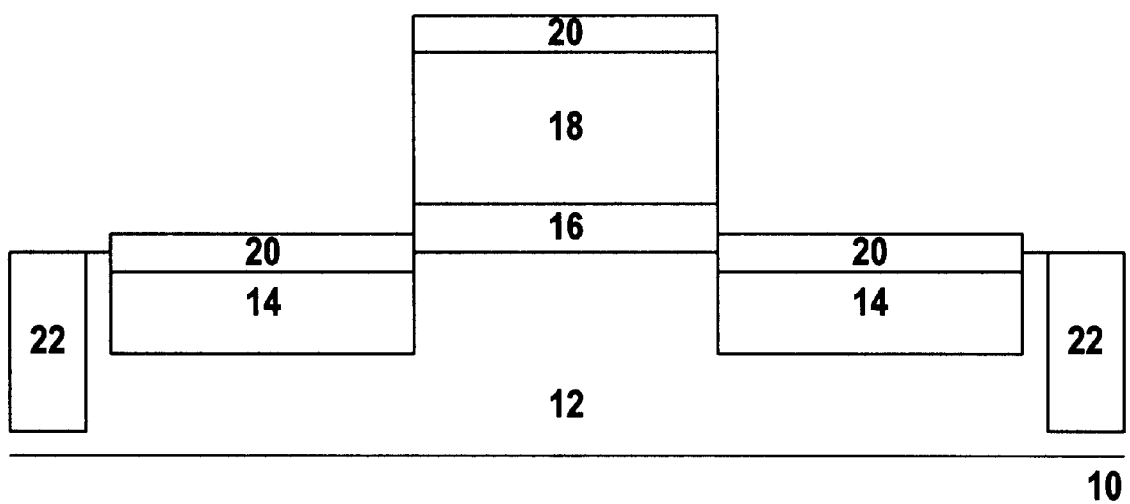
FIG. 1 is a cross sectional view of a portion of an integrated circuit.

Referring now to FIG. 1 there is depicted a cross sectional view of a portion of an integrated circuit 10, formed in a substrate 12, such as a semiconducting substrate like silicon, germanium, and III–V compounds such as gallium arsenide. Most preferably the substrate is silicon and the integrated circuit 10 is of the metal-oxide-semiconductor family, such as NMOS, PMOS, or CMOS.

The integrated circuit 10 preferably has various structures that have been formed, some of which are depicted in FIG. 1, such as electrical isolation structures 22, source regions 14 and drain regions 14, gate insulation layer 16, gate electrode 18, and contacts 20. These and other structures are representative of the various processes that are used to fabricate a completed, functional integrated circuit 10.

Obviously, not all of the processes that are used to form these various structures are accomplished concurrently. Rather, processes that are used to form structures deeper within or closer to the substrate 12 are generally performed prior to other processes that are used to form structures farther from the substrate 12. Some of these preceding processes create structures that are sensitive to the amount of thermal energy that is subsequently delivered to the integrated circuit 10. Similarly, some of these succeeding processes deliver differing amounts of thermal energy to the integrated circuit 10. As mentioned above, it is desirable to standardize the preceding processes so that just one or a relatively limited number of preceding process selections are required to produce structures that are properly characterized, regardless of the amount of thermal energy that is delivered by the required succeeding processes.

For example, the processes used to form the source and drain regions 14 within the substrate 12 tend to be sensitive to the amount of thermal energy that is subsequently delivered to the integrated circuit 10. Although depicted in very basic form in FIG. 1, the junctions between the source and drain regions 14 and the substrate 12 can be very complex in actual implementation. Thus, for integrated circuits 10 that receive different processing thereafter, different processes for the formation of the source drain 14 junctions are typically selected. These different processes are characterized so that the proper structures are produced after the selected succeeding processes are completed.

On the other hand, formation of structures such as the gate oxide layer 16 typically deliver thermal energy to the integrated circuit 10. Different integrated circuits 10 tend to require gate oxide layers 16 with different properties, such as thickness. Thus, different processes that are used to form the different gate oxide layers 16 tend to deliver differing amounts of thermal energy to the integrated circuit 10.

If a single process was used to form the source drain regions 14, then the different processes used to form the different gate oxide layers 16 would alter the source drain regions 14 in different ways. Thus, the integrated circuits 10 so produced would have junction characteristics that were different one from another, dependent upon the gate oxide process that was used. This would be an undesirable outcome.

By way of further example, contacts 20 tend to be formed such as by inter diffusing a metallic layer with a semiconducting layer to form an ohmic contact. The degree to which such inter diffusions occurs with some metallic layers is dependent at least in part upon the amount of subsequent thermal energy delivered to the integrated circuit 10. Thus, this process also tends to be somewhat sensitive to subsequent thermal energy delivery processes.

Figure 2:
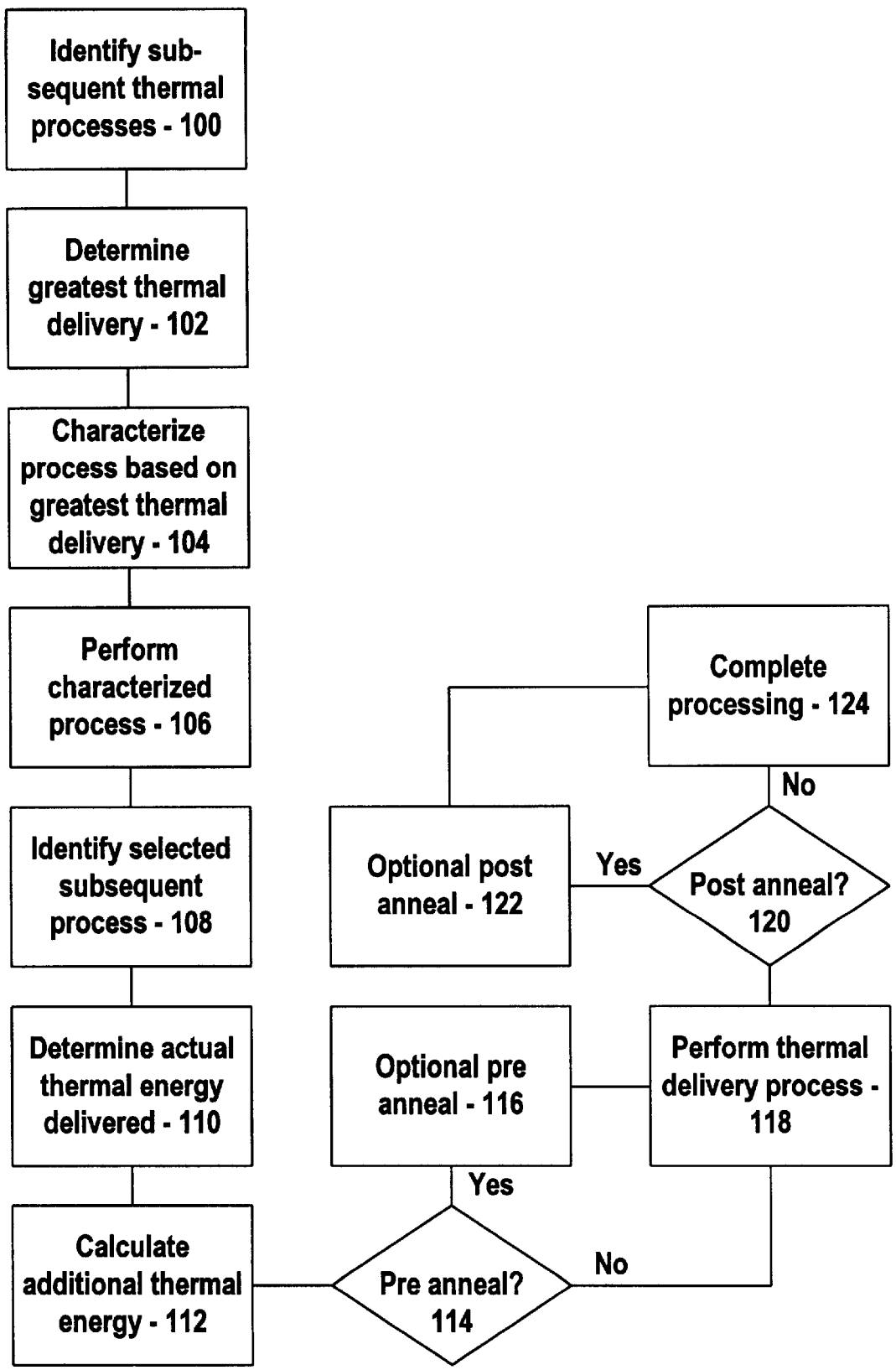
FIG. 2 is a flow chart of a process according to a preferred embodiment of the invention.

FIG. 2 depicts a flow chart of a preferred method according to the present invention for overcoming the difficulties as described above. As a part of this method, the thermal energy delivery processes are identified as given in block 100. It is appreciated that these thermal energy delivery processes may have other functions other than the delivery of thermal energy to the integrated circuit 10 as their primary functions, and that the delivery of thermal energy to the integrated circuit 10 may be completely incidental to their primary functions.

Further, the succeeding thermal energy delivery process may be more than a single process step. Rather, it may be in the form of a set of related process steps, one or more of which deliver thermal energy to the integrated circuit 10, and which are thus considered together as a single process flow.

The process that delivers the greatest amount of thermal energy is determined, as given in block 102. It is appreciated that many of the processes identified in step 100 may deliver equivalent amounts of thermal energy. Thus, when it is said herein that the processes each deliver different amounts of thermal energy, it is not meant that each and every process delivers an amount of thermal energy that is different from any of the other processes, but rather that all of the processes do not deliver the same amount of thermal energy to the integrated circuit 10.

As given in block 104, the preceding thermally sensitive process is characterized based upon the greatest amount of thermal energy. In other words, the parameters for the preceding thermally sensitive process-are set based at least in part upon an expectation that an amount of thermal energy will subsequently be delivered to the integrated circuit 10, which amount of thermal energy is substantially equal to the greatest amount of thermal energy as determined in block 102, and that after that greatest amount of thermal energy is delivered, the structure formed during the preceding thermally sensitive process will be in a condition where it can operate according to the desired design criteria.

The characterized preceding thermal energy sensitive process is performed in proper order, as given in block 106. It is appreciated that preceding thermal energy sensitive process may have many process steps before and after it in the fabrication of the integrated circuit 10. It is further appreciated that the succeeding thermal energy delivery process may immediately follow the preceding thermal energy sensitive process, or more likely, there may be one or many intervening process steps between the preceding thermal energy sensitive process and the succeeding thermal energy delivery process.

The desired succeeding thermal energy delivery process is selected, as given in block 108, and the actual amount of thermal energy which it delivers is determined as given in block 110. The difference between the actual amount of thermal energy to be delivered by the selected succeeding process and the greatest amount of thermal energy that could be delivered by any other succeeding process is determined as given in block 112. This difference in the amounts of thermal energy is called an additional amount of thermal energy for convenience herein.

According to preferred method according to the present invention, this difference in the amount of delivered thermal energy is added to one or both of a thermal energy delivery process to occur either before or after the selected succeeding thermal energy delivery process. This delivery of additional thermal energy may be accomplished either immediately prior to or immediately subsequent to the succeeding thermal energy delivery process, or may occur at some other point in the fabrication process.

For example, many process steps use one or both of a pre thermal anneal and a post thermal anneal. Either or both of these two process steps could be used for the delivery of the additional thermal energy. For example, a gate oxidation process typically uses a pre thermal anneal to heat the substrate 12, then forms the gate oxide layer 16, then uses a post thermal anneal to anneal the gate oxide layer 16 that has been formed.

In the case where the gate oxidation process selected is not the one that delivers the greatest amount of thermal energy to the integrated circuit 10, or the selected combination of pre thermal anneal, gate oxidation, and post thermal anneal do not deliver the greatest amount of thermal energy to the integrated circuit 10, then the additional amount of thermal energy, calculated as given above, is preferably selectively added to at least one of the pre thermal anneal or the post thermal anneal so that in total, the greatest amount of thermal energy, upon which the preceding thermal energy sensitive process is based, is delivered to the integrated circuit 10.

A decision is made as to whether a pre anneal is to be accomplished for the succeeding thermal energy delivery process, as given in block 114. If it is to be accomplished, then the pre anneal process is performed, as given in block 116. As desired, either none, some, or all of the additional thermal energy can be added to the pre anneal process accomplished in block 116. Regardless of whether the pre thermal anneal is accomplished, the selected one of the succeeding thermal energy delivering processes is performed, as given in block 118.

A decision is made as to whether a post anneal is to be accomplished for the succeeding thermal energy delivery process, as given in block 120. If it is to be accomplished, then the post anneal process is performed, as given in block 122. As desired, either none, some, or all of the additional thermal energy remaining after the optional pre anneal process can be added to the posted anneal process accomplished in block 116. Most preferably, as between the pre anneal process and the post anneal process, all of the additional thermal energy required is delivered to the integrated circuit 10. The processing of the integrated circuit 10 is then completed, as given in block 124.

Most preferably, the additional thermal energy is delivered to the integrated circuit 10 in a chemically inert environment, so as to not otherwise cause an impact upon the integrated circuit 10. However, in alternate embodiments the additional thermal energy is delivered in conjunction with desired processes, which are either not changed by the additional thermal energy, or which are modified so as to be optimized by the additional thermal energy.

The additional thermal energy is a function of several parameters, including the temperature of the processing step to which it is added, and the length of time of the processing step to which it is added. Thus, these two parameters at least can be balanced as desired to deliver the desired additional thermal energy. For example, an existing thermal anneal can be accomplished for the same length of time at a higher temperature, if that is the preferred method of delivering the additional thermal energy, or an existing thermal anneal can be accomplished at the same temperature for an additional length of time, if that is the preferred method of delivering the additional thermal energy. Other combinations of parameters can also be extrapolated from the two examples given above, and are within the comprehension of the present invention.

It is appreciated that many of the steps of the preferred method as described above do not need to be accomplished in the order as given. For example, all of the steps where different elements are identified and determined can be accomplished at the start of the process, and then actual processing can be accomplished as the ending steps of the process. Further, once some steps have been accomplished the first time, they do not necessarily need to be performed again. For example, determining the succeeding thermal energy delivery process that delivers the greatest amount of thermal energy only needs to be accomplished once, unless the processes are changed at a later point in time.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of standardizing a fabrication process for an integrated circuit, where the fabrication process includes a preceding thermal energy sensitive process and at least one set of selectable succeeding thermal energy delivery processes, where each one of the set of selectable succeeding thermal energy delivery processes delivers different amounts of thermal energy to the integrated circuit, where one of the different amounts of thermal energy is a greatest amount of thermal energy as compared to the different amounts of thermal energy the method comprising the steps of:

forming an integrated circuit structure using the preceding thermal energy sensitive process, where the preceding thermal energy sensitive process is characterized based upon the greatest amount of thermal energy delivered to the integrated circuit by one of the set of selectable succeeding thermal energy delivery processes, and in the case where one of the set of selectable succeeding thermal energy delivery processes is selected that delivers an actual amount of thermal energy to the integrated circuit that is less than the greatest amount of thermal energy, delivering an additional amount of thermal energy to the integrated circuit equal to a difference between the actual amount of thermal energy and the greatest amount of thermal energy.

2. The method of claim 1 wherein the at least one set of selectable succeeding thermal energy delivery processes comprises oxidation processes.

3. The method of claim 1 wherein the at least one set of selectable succeeding thermal energy delivery processes comprises gate oxidation processes.

4. The method of claim 1 wherein the at least one set of selectable succeeding thermal energy delivery processes comprises deposition anneal processes.

5. The method of claim 1 wherein the preceding thermal energy sensitive process comprises implantation of a dopant.

6. The method of claim 1 wherein the preceding thermal energy sensitive process comprises fabrication of a transistor junction.

7. The method of claim 1 wherein the preceding thermal energy sensitive process comprises fabrication of an inter diffused region between two adjacent dissimilar material layers.

8. The method of claim 1 wherein the preceding thermal energy sensitive process comprises fabrication of a silicide region.

9. The method of claim 1 wherein the additional amount of thermal energy is delivered to the integrated circuit as a thermal anneal in a chemically non reactive environment.

10. In a method of fabricating an integrated circuit, where the method includes a preceding thermal energy sensitive process and at least one set of selectable succeeding thermal energy delivery processes, where each one of the set of selectable succeeding thermal energy delivery processes delivers different amounts of thermal energy to the integrated circuit, where one of the different amounts of thermal energy is a greatest amount of thermal energy as compared to the different amounts of thermal energy, the improvement comprising the steps of:

forming an integrated circuit structure using the preceding thermal energy sensitive process, where the preceding thermal energy sensitive process is characterized based upon the greatest amount of thermal energy delivered to the integrated circuit by one of the set of selectable succeeding thermal energy delivery processes, and in the case where one of the set of selectable succeeding thermal energy delivery processes is selected that delivers an actual amount of thermal energy to the integrated circuit that is less than the greatest amount of thermal energy, delivering an additional amount of thermal energy to the integrated circuit equal to a difference between the actual amount of thermal energy and the greatest amount of thermal energy.

11. The method of claim 10 wherein the at least one set of selectable succeeding thermal energy delivery processes comprises oxidation processes.

12. The method of claim 10 wherein the at least one set of selectable succeeding thermal energy delivery processes comprises gate oxidation processes.

13. The method of claim 10 wherein the at least one set of selectable succeeding thermal energy delivery processes comprises deposition anneal processes.

14. The method of claim 10 wherein the preceding thermal energy sensitive process comprises implantation of a dopant.

15. The method of claim 10 wherein the preceding thermal energy sensitive process comprises fabrication of a transistor junction.

16. The method of claim 10 wherein the preceding thermal energy sensitive process comprises fabrication of an inter diffused region between two adjacent dissimilar material layers.

17. The method of claim 10 wherein the preceding thermal energy sensitive process comprises fabrication of a silicide region.

18. The method of claim 10 wherein the additional amount of thermal energy is delivered to the integrated circuit as a thermal anneal in a chemically non reactive environment.

19. A method of standardizing a fabrication process for an integrated circuit, where the fabrication process includes fabrication of a transistor junction and a set of selectable gate oxidation processes, where each one of the set of selectable gate oxidation processes delivers different amounts of thermal energy to the integrated circuit, where one of the different amounts of thermal energy is a greatest amount of thermal energy as compared to the different amounts of thermal energy the method comprising the steps of:

forming the transistor junction, where the transistor junction is characterized based upon the greatest amount of thermal energy delivered to the integrated circuit by one of the set of selectable gate oxidation processes, and in the case where one of the set of selectable gate oxidation processes is selected that delivers an actual amount of thermal energy to the integrated circuit that is less than the greatest amount of thermal energy, delivering an additional amount of thermal energy to the integrated circuit equal to a difference between the actual amount of thermal energy and the greatest amount of thermal energy.

20. The method of claim 19 wherein the additional amount of thermal energy is delivered to the integrated circuit as a thermal anneal in a chemically non reactive environment as a part of at least one of a pre gate oxidation anneal and a post gate oxidation anneal.

* * * * *